(12) United States Patent
Sharma et al.

(10) Patent No.: US 6,979,998 B2
(45) Date of Patent: *Dec. 27, 2005

(54) MAGNETIC FILTER

(75) Inventors: Manish Sharma, Mountain View, CA (US); Manoj K. Bhattacharyya, Cupertino, CA (US); Brian R. Short, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 407 days.

This patent is subject to a terminal disclaimer.

(21) Appl. No.: 10/417,054

(22) Filed: Apr. 16, 2003

(65) Prior Publication Data

US 2004/0207399 A1 Oct. 21, 2004

(51) Int. Cl.[7] ............................................. G01R 33/02
(52) U.S. Cl. ..................... 324/252; 327/552; 257/421
(58) Field of Search ................ 324/244, 252, 324/260; 327/551, 552, 557, 558; 333/204, 333/202; 257/425, 421; 455/339

(56) References Cited

U.S. PATENT DOCUMENTS

| | | | | |
|---|---|---|---|---|
| RE29,578 | E * | 3/1978 | Javan | 250/214 R |
| 4,389,614 | A * | 6/1983 | Staiger | 327/141 |
| 6,011,814 | A | 1/2000 | Martinez et al. | |
| 6,087,905 | A * | 7/2000 | Makino et al. | 333/1.1 |
| 6,232,777 | B1 * | 5/2001 | Sato et al. | 324/252 |
| 6,549,454 | B1 * | 4/2003 | Slaughter | 365/158 |
| 6,720,844 | B1 * | 4/2004 | Lakin | 333/189 |
| 2003/0144152 | A1 * | 7/2003 | Uzawa et al. | 505/400 |

OTHER PUBLICATIONS

He, Yiping et al., Hybrid Magnetic Tunnel Juntion/Vertical Cavity Surface Emitting Laser Field Sensor Device, Nov. 2001, Electronic Letters, vol. 37, No. 24, all.*
Reed, Daniel S., et al., Low Frequency Noise in Magnetic Tunnel Junctions, Jul. 2001, IEEE Transactions on Magnetics, vol. 37, No. 4, all.*
Shimazawa, K. et al., Frequency Response of Common Lead and Shield Type Magnetic Tunneling Junction Head, Jul. 2001, IEEE Transactions on Magnetics, vol. 37, No. 4, all.*
Lu Yu et al, observation of magnetic switching in submicronmagnetic-tunnel junctions at low frequency, journel of applied physics, american institue of physics, Apr. 15, 1999.
Bauer M et al, journal of applied physics, american institue of physics, Jan. 1, 2002.

* cited by examiner

*Primary Examiner*—Bot Ledynh
*Assistant Examiner*—Kenneth J Whittington
(74) *Attorney, Agent, or Firm*—Brian R. Shert

(57) ABSTRACT

The invention includes a magnetic filter. The magnetic filter includes a magnetic transducer for generating a magnetic field in response to the plurality of information carrying signals. The magnetic filter further includes a magnetic tunnel junction. The magnetic tunnel junction can be tuned to switch states in response to selected frequencies of the magnetic field. The magnetic filter can further include a magnetic tunnel junction sensor for sensing the states of the magnetic tunnel junction.

25 Claims, 11 Drawing Sheets

MAGNETIC FILTER

FIELD OF THE INVENTION

The invention relates generally to filtering electronic signals. More particularly, the invention relates to an apparatus, system and method of filtering multiple signals of various frequencies.

BACKGROUND OF THE INVENTION

Communication systems generally include transmission of multiple carrier signals in which each of the carrier signals is transmitted at a different transmit frequency. Each individual transmission signal is typically modulated by an information signal. Each of the transmission signals can be individually received, and the information signals can be detected.

FIG. 1 shows a frequency spectrum of multiple transmission signals. The transmission signals each include a carrier frequency FC1, FC2, FC3, FC4. The frequency spectrum allocated to each of the carrier frequencies is generally referred to as a transmission channel. The amount of frequency spectrum allocated to each transmission channel generally determines the amount of information that can be transmitted through the transmission channel. It is desirable to utilize as much of the allocated frequency spectrum as possible.

The frequency spectrum of FIG. 1 shows transmission signals 110, 120, 130, 140 at the carrier frequencies FC1, FC2, FC3, FC4. Frequency spectrum adjacent to each of the transmission signals 110, 120, 130, 140 is generally occupied by information that is modulated onto the transmission signals 110, 120, 130, 140. Generally, the greater the modulation rate of the information (typically, the modulation rate is proportional to the amount of information) the greater the amount of frequency spectrum occupied by each transmission signal and associated modulation information. The modulation rate of each transmission signal should not be so large that the modulation information of one transmission signal interferes with the modulation information of a neighboring transmission signal.

FIG. 2 shows a frequency spectrum of multiple transmission signals 210, 220, 230, 240 in which information from neighboring transmission channels overlap. That is, information intended for transmission through one transmission channel, is unintentionally transmitted within another transmission channel. For example, the modulation information of the first transmission signal 210 overlaps with the modulation information of the second transmission signal 220, as designated 215. The modulation information of the second transmission signal 220 overlaps with the modulation information of the third transmission signal 230, as designated 225. The modulation information of the third transmission signal 230 overlaps with the modulation information of the fourth transmission signal 240, as designated 235.

The overlap can be due to distortion of the transmission signals due to components within a transmission system being non-ideal. The distortion can include noise, spurious signals and harmonics of transmission signals overlapping with neighboring transmission signals.

Information signal channel frequency overlap from one transmission channel to another transmission channel, introduces transmission errors. Transmission errors reduce the effectiveness of a communication system. Additionally, transmission errors can reduce the transmission bandwidth of a communication.

It is desirable to have a method and apparatus that provides selective filtering of multiple frequency signals. It is desirable to provide high frequency filtering of communication signals to reduce the amount of frequency spectrum overlap between transmission signals of the communication signals.

SUMMARY OF THE INVENTION

The invention includes an apparatus and method of providing selective filtering of multiple frequency signals. The apparatus and method can provide filtering of communication signals to reduce the amount of frequency spectrum overlap between transmission signals of the communication signals.

An embodiment of the invention includes a magnetic filter. The magnetic filter includes a magnetic transducer for generating a magnetic field in response to the plurality of information carrying signals. The magnetic filter further includes a magnetic tunnel junction. The magnetic tunnel junction can be tuned to switch states in response to selected frequencies of the magnetic field. The magnetic filter can further include a magnetic tunnel junction sensor for sensing the states of the magnetic tunnel junction.

Other aspects and advantages of the present invention will become apparent from the following detailed description, taken in conjunction with the accompanying drawings, illustrating by way of example the principles of the invention.

DETAILED DESCRIPTION

Figure 1:
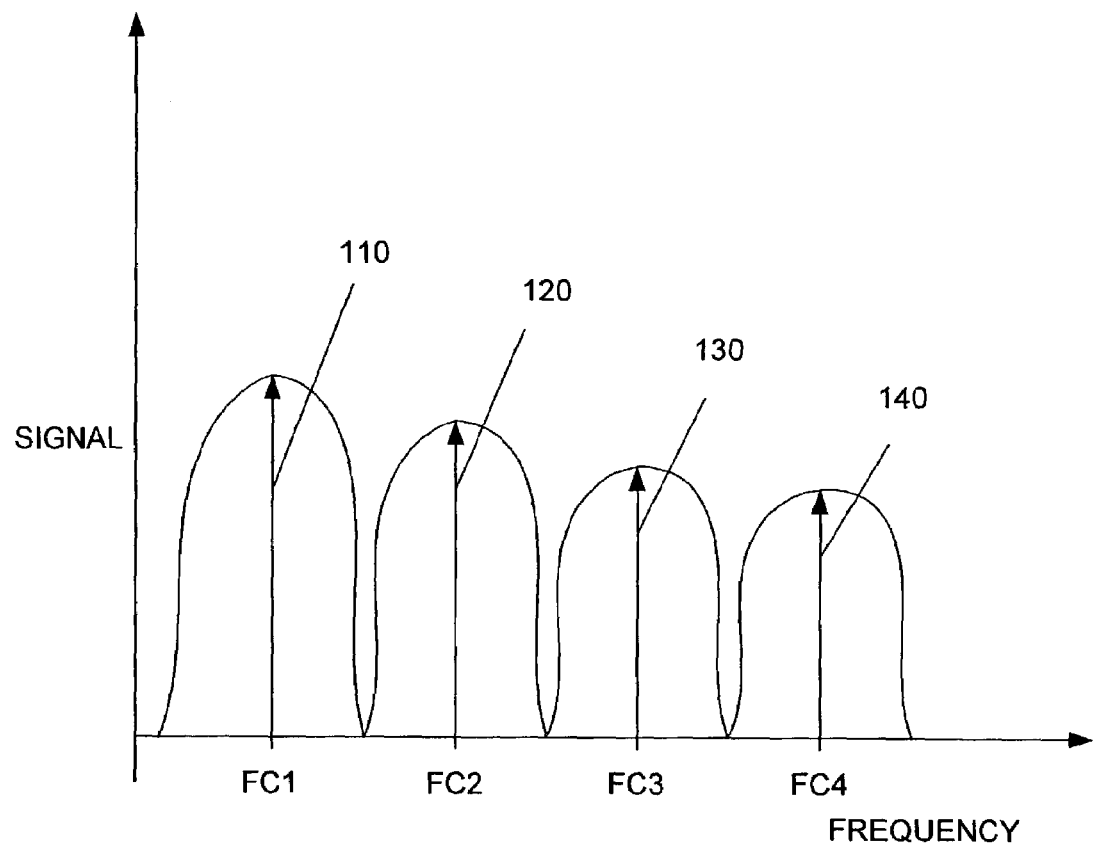
FIG. 1 shows a frequency spectrum of several modulated carrier signals.
Figure 2:
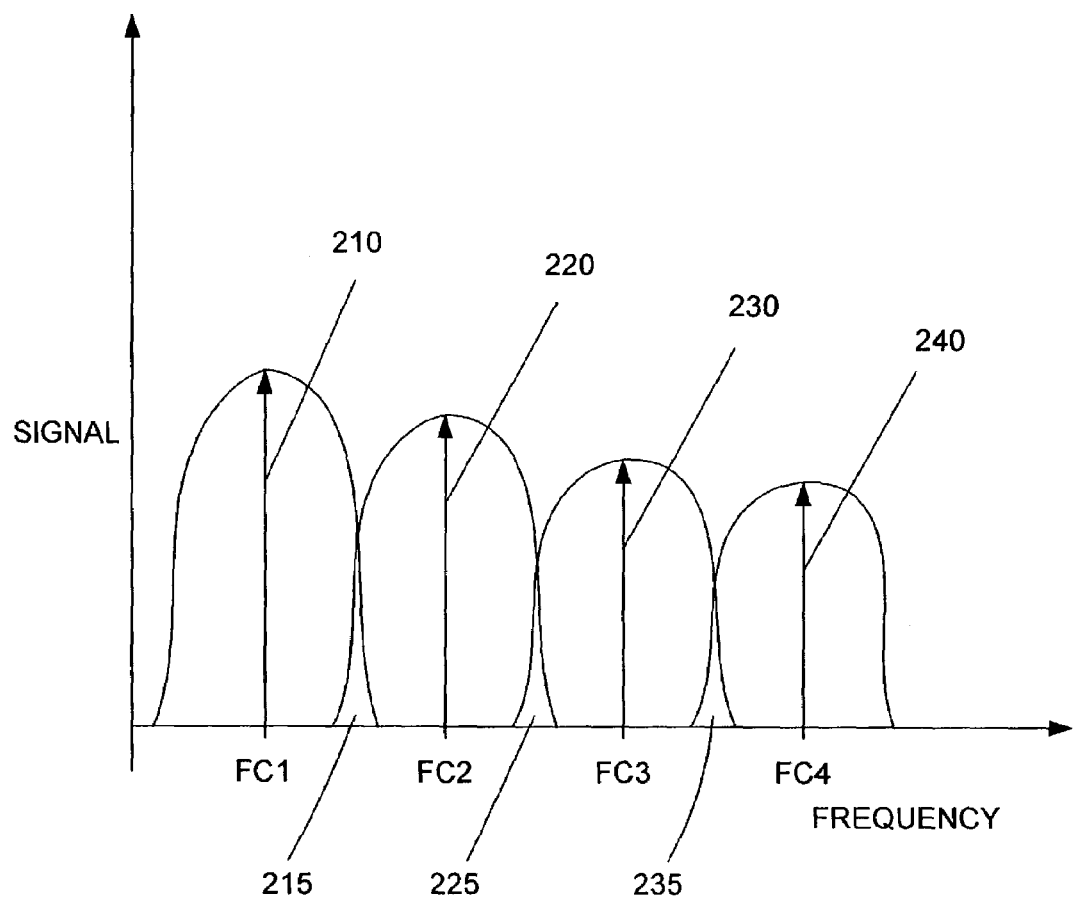
FIG. 2 shows a frequency spectrum of several modulated carrier signals that include frequency spectrum overlap between neighboring channels.

As shown in the drawings for purposes of illustration, the invention is embodied in an apparatus and method of high-frequency filtering of communication signals to reduce the amount of frequency spectrum overlap between transmission signals of the communication signals.

Figure 3:
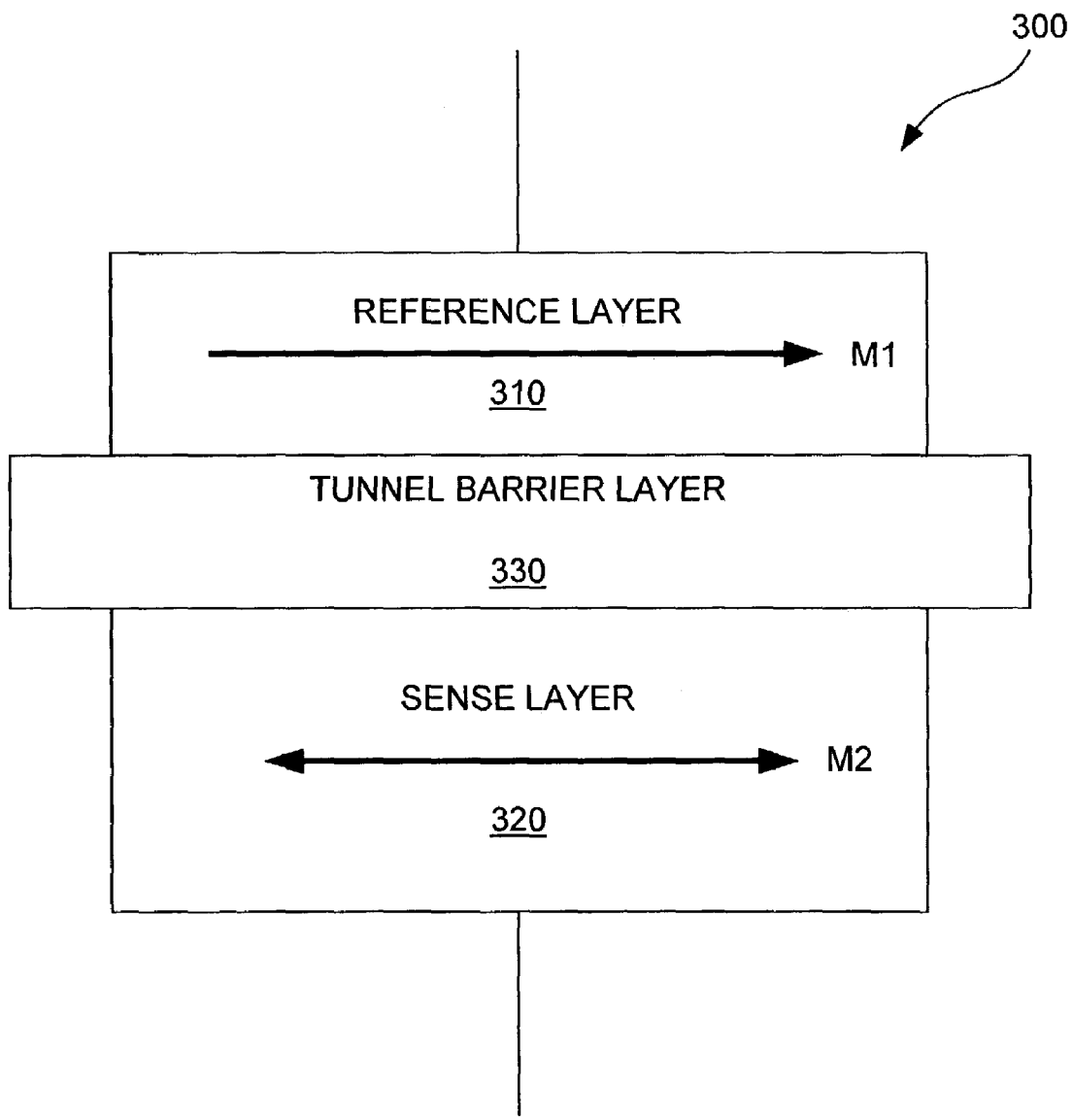
FIG. 3 shows a magnetic tunnel junction sensor.

FIG. 3 shows an embodiment of a magnetic tunnel junction sensor 300 that includes a reference layer 310, a sense layer 320 and an insulating layer 330.

The magnetic tunnel junction sensor 300 can be used to detect the presence of a magnetic field. A magnetic tunnel junction sensor based on tunneling magneto-resistive devices can include spin dependent tunneling junctions. The reference layer 310 has a magnetization orientation that is fixed so as not to rotate in the presence of an applied magnetic field in a range of interest. The sense layer 320 has a magnetization that can be oriented in either one of two directions. If the magnetizations of the reference layer 310 and the sense layer 320 are in the same direction, the orientation of the spin-dependent tunnel junction is said to be parallel. If the magnetizations of the reference layer 310 and the sense layer 320 are in opposite directions, the orientation of the spin-dependent tunnel junction is said to be anti-parallel. The two stable orientations, parallel and anti-parallel, may correspond to logic values of "0" and "1".

The magnetic orientation of the sense layer 320 is generally aligned in a direction corresponding to a direction of the last external magnetic field in the vicinity of the sense layer 320. The external magnetic field must have enough magnetic strength to alter the orientation of the sense layer 320 in order for the magnetic field to be detected.

A resistance across the magnetic tunnel junction sensor 300 will vary in magnitude depending upon the magnetic orientation of the sense layer 320 with respect to the magnetic orientation of the reference layer 310. Typically, if the sense layer 320 has a magnetic orientation that is in the opposite direction as the reference layer 310, then the resistance across the magnetic tunnel junction sensor 300 will be large. If the sense layer 320 has a magnetic orientation that is in the same direction as the reference layer 310, then the resistance across the magnetic tunnel junction sensor 300 will be less. Therefore, the resistance across the magnetic tunnel junction sensor 300 can be used to sense the direction of a magnetic field because the direction of the magnetic field determines the magnetic orientation of the sense layer 320 with respect to the reference layer 310, and therefore, the resistance across the magnetic sensor 300.

The reference layer 310 and the sense layer 320 can be made of a ferromagnetic material. The reference layer 310 can be implemented with a magnetically soft reference layer, or with a magnetically pinned layer.

If the magnetization of the sense layer 320 and the reference layer 310 of the magnetic tunnel junction sensor 300 are in the same direction, the orientation of the magnetic tunnel junction sensor 300 can be referred to as being "parallel." If the magnetization of the sense layer 320 and the reference layer 310 of the magnetic tunnel junction sensor are in opposite directions, the orientation of the magnetic tunnel junction sensor can be referred to as being "anti-parallel." The two orientations, parallel and anti-parallel, can correspond to magnetic sensor states of low or high resistance.

The insulating tunnel barrier 330 allows quantum mechanical tunneling to occur between the reference layer 310 and the sense layer 320. The tunneling is electron spin dependent, causing the resistance of the magnetic tunnel junction sensor to be a function of the relative orientations of the magnetization directions of the reference layer 310 and the sense layer 320. The presence of a magnetic field can be detected by establishing the magnetization orientations of the reference layer 310 and the sense layer 320.

The resistance of the magnetic tunnel junction sensor 300 is a first value (R) if the magnetization orientation of the magnetic tunnel junction sensor 300 is parallel and a second value (R+delta) if the magnetization orientation is anti-parallel. The invention, however, is not limited to the magnetization orientation of the two layers, or to just two layers.

The insulating tunnel barrier 330 can be made of aluminum oxide, silicon dioxide, tantalum oxide, silicon nitride, aluminum nitride, or magnesium oxide. However, other dielectrics and certain semiconductor materials may also be used for the insulating tunnel barrier 330. The thickness of the insulating tunnel barriers 330 may range from about 0.5 nanometers to about three nanometers. However, the invention is not limited to this range.

The sense layer 320 may be made of a ferromagnetic material. Both the sense layer 320 and the reference layer 310 can be implemented as a synthetic ferrimagnet (SF), also referred to as an artificial antiferromagnet.

The sense layer 320 of the tunnel junction sensor 300 will generally align in a direction that corresponds with a direction of an externally applied magnetic field.

Figure 4:
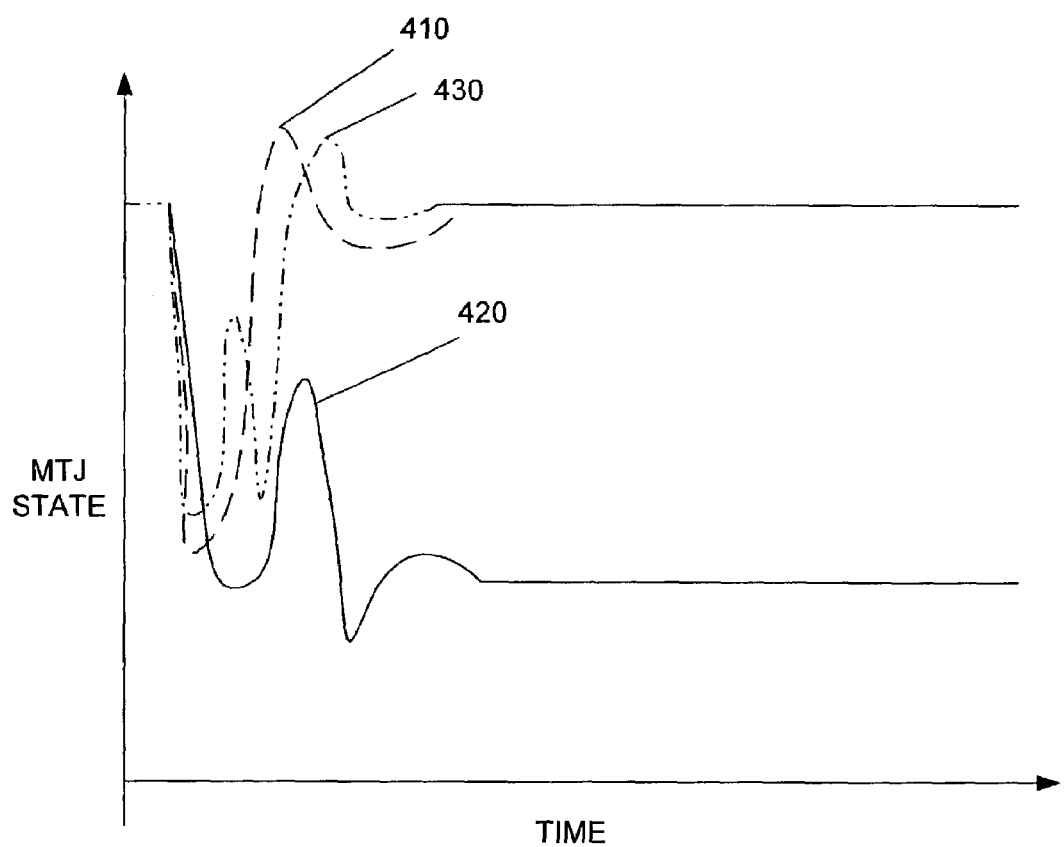
FIG. 4 shows waveforms depicting switching of a magnetic tunnel junction sensor when magnetic switching signals of varying pulse widths are applied to the magnetic tunnel junction sensor.

FIG. 4 shows waveforms depicting switching of a magnetic tunnel junction sensor when magnetic switching signals of varying pulse widths are applied to the magnetic tunnel junction sensor. A first waveform 410 depicts the state of the magnetic tunnel junction sensor when a magnetic field having a pulse width of 125 ps is applied. A second waveform 420 depicts the state of the magnetic tunnel junction sensor when a magnetic field having a pulse width of 250 ps is applied. A third waveform 430 depicts the state of the magnetic tunnel junction sensor when a magnetic field having a pulse width of 350 ps is applied. The amplitude of the magnetic field applied is 200 Oe for each of the waveforms.

The waveforms show that the magnetic tunnel junction sensor is more likely to switch states for particular pulse widths rather than others. For example, the waveforms of FIG. 4 show the magnetic tunnel junction sensor switching states of a pulse width of 250 ps.

Due to a switching characteristic of magnetic tunnel junctions (generally referred to as precessional switching), magnetic tunnel junctions will switch for pulses of particular pulse widths, but not for other pulse widths. Typically, there are many selective ranges of pulse widths that cause the magnetic tunnel junction to switch. The pulse widths can be equated to periods of sinusoidal waveforms. Sinusoidal waveforms that include "on" period equivalent to the selected pulse widths can cause the magnetic tunnel junction to change states. This time/frequency selective characteristic of magnetic tunnel junctions allows the magnetic tunnel junctions to be used as a selective switch or filter.

The selective time/frequency switching characteristics of magnetic tunnel junctions can be experimentally or computationally determined. Therefore, the magnetic tunnel junctions can be tuned to selectively pass signals that include particular frequencies.

Many applications exist that can utilize the selective signal frequency pass bands of the invention. The descriptions provided here of signal transmitters and signal receivers that can utilize a frequency comb filter as provided by the invention are merely examples of useful applications of the invention. The invention can be utilized in many different applications where high frequency selective filtering is beneficial.

Precessional Switching

Precessional switching is a phenomenon that can be used to describe the transitional regions of the switching curves of FIG. 4. Precessional switching will first be described as applied to a single magnetic dipole, and then as applied to a magnetic tunnel junction of the invention.

Figure 5A:
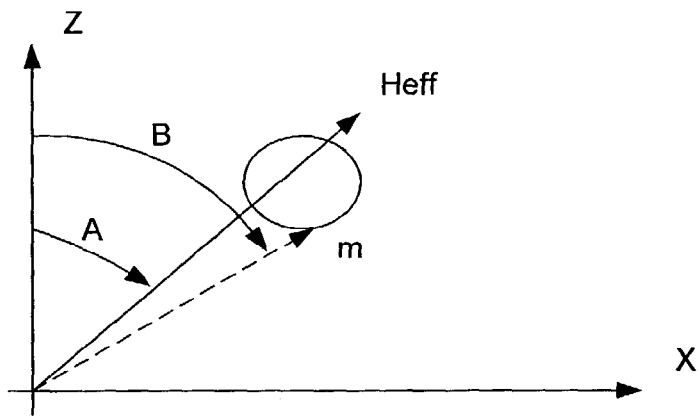
FIG. 5A shows a magnetic dipole and an applied magnetic field.

FIG. 5A shows a magnetic moment m of a single magnetic dipole. If a magnetic field Heff is applied to the magnetic dipole, the magnetic dipole will experience precession about an axis of the applied magnetic field Heff as the magnetic dipole attempts to align with the applied magnetic field Heff. The precession is depicted by a circular rotation 510 about the axis of the applied magnetic field Heff.

As shown in FIG. 5A, the axis of the applied magnetic field Heff is at an angle A with respect to the depicted z-axis, and the magnetic moment of the dipole is at an angle B with respect to the depicted z-axis.

The precession can be calculated by an equation of motion as given by:

$(1/\gamma)(dm/dt)=m\times Heff$, where m is the magnetic moment of the dipole, and $\gamma$ is the well known gyromagnetic ratio. A standard value of $\gamma$ can be given as $1.76\times 10^7 Oe^{-1} s^{-1}$.

The estimated precession of the magnetic tunnel junctions of the invention, further include damping and exchange interactions between a large number of dipoles that are used to model the sense layer of the magnetic tunnel junction. Once these factors are included, and the calculations summed for all dipoles of a ferromagnetic bit of a magnetic tunnel junction, a final equation of motion generally termed the Landau-Lifshitz-Gilbert equation can be used to determine the precession of the magnetic tunnel junction. This equation of motion can be represented as:

$(dM/dt)=-\gamma(M\times(\delta w/\delta M)-(\alpha/M)(M\times(dM/dt))$; where M is the magnetization vector, $\gamma$ is the gyromagnetic ratio, $\alpha$ is a damping ratio, $(\delta w/\delta M)$ is a total derivative of the energy density with magnetization Heff.

Figure 5B:
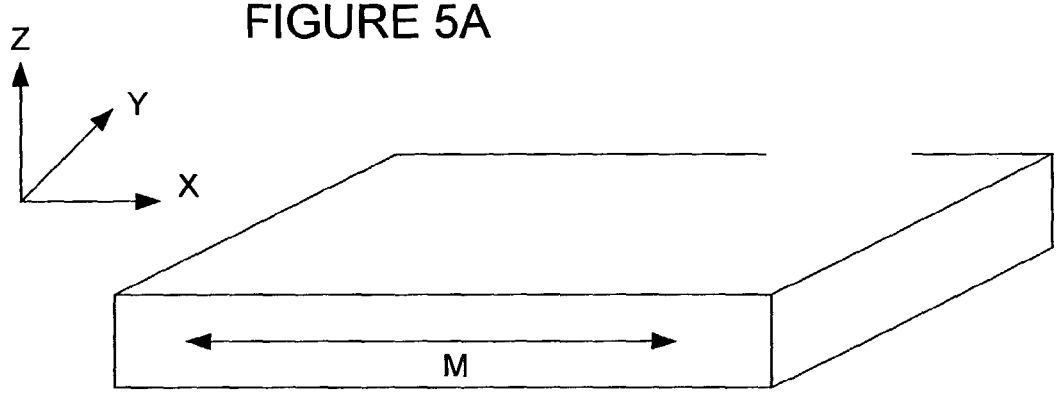
FIG. 5B shows a sense layer of a magnetic tunnel junction.

FIG. 5B shows a sense layer of a magnetic tunnel junction and the corresponding x-axis, y-axis and z-axis.

Figure 5C:
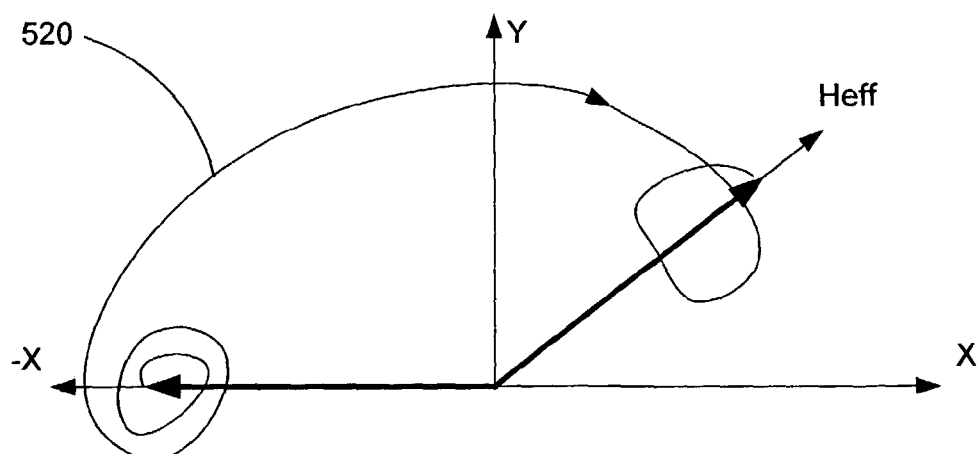
FIG. 5C shows the precessional motion of a magnetization vector of a magnetic tunnel junction.

FIG. 5C shows an example of the precession of the magnetization M (also referred to as the net magnetic moment) of the sense layer as calculated by the previously described Landau-Lifshitz-Gilbert equation.

As shown in FIG. 5C, initially, the magnetization vector M of the magnetic tunnel junction is oriented along the x-axis. Once the magnetic field Heff is applied, the magnetization vector M begins to rotate and change direction according to the line 520 as the magnetization vector M attempts to align with the magnetic field Heff. The speed at which the magnetization vector M changes directions is dependent upon the damping elements of the motion, and geometry and materials of the magnetic tunnel junction. The motion can be simulated by the Landau-Lifshitz-Gilbert equation using micromagnetic models in the dynamic domain (that is, time scales of less than 1 ns).

For the invention, the precession is modeled to provide predictions of the exact amplitude and duration of a magnetic pulse required to cause the magnetization vector of a magnetic tunnel junction to switch. The duration and amplitude of the applied magnetic pulse are varied to identify specific frequencies at which the magnetic tunnel junction will switch. The selective switching frequencies are used to provide the filter effects of the invention.

Figure 6:
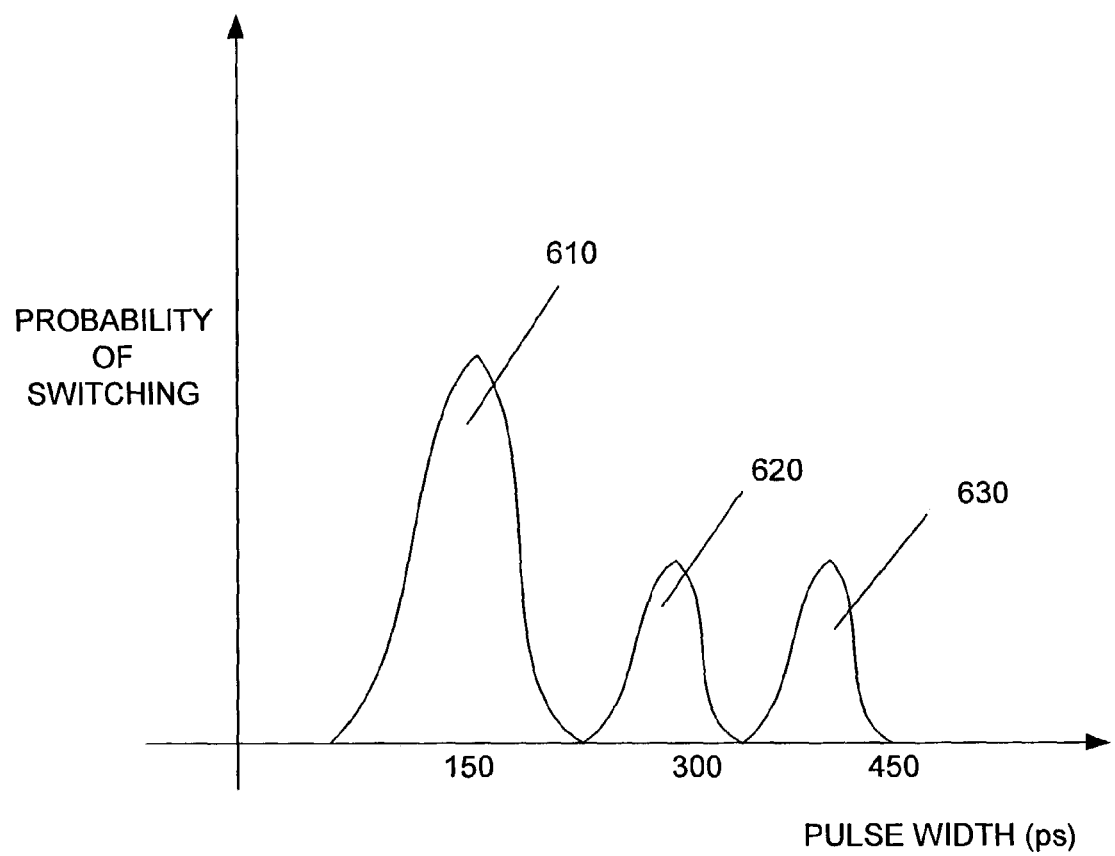
FIG. 6 shows a plot depicting a probability that a magnetic tunnel junction will change states when magnetic switching signals of varying pulse widths are applied to the magnetic tunnel junction sensor.

FIG. 6 shows a plot depicting a probability that a magnetic tunnel junction will change states when magnetic switching signals of varying pulse widths are applied to the magnetic tunnel junction sensor. A first peak 610 occurs for a pulse width of 150 ps. A second peak 620 occurs for a pulse width of 290 ps. A third peak 630 occurs for a pulse width of 430 ps.

All of the pulses include an amplitude of 200 Oe. The pulse width may vary for different pulse amplitudes.

According to the plot, pulse widths of 150 ps, 290 ps and 430 ps are more likely to cause the magnetic tunnel junction to change states. This plot can be used to determine the pass band frequencies of a comb filter formed by the magnetic tunnel junction. Generally, signals will be passed that have a frequency that includes a time period that is equivalent to the pulse widths of the pulses that cause the tunnel magnetic junction to switch.

For example, if a signal that includes an amplitude of greater than 200 Oe for a duration of 150 ps, will cause the magnetic tunnel junction to switch states, and the signal will not be filtered (that is, it will pass through) by the magnetic tunnel junction.

The pass bands of the magnetic comb filter of the invention can be tuned. That is, the pass bands of the comb filter can be tuned. The tuning can be accomplished by manipulating the materials within the MTJ, or by manipulating the physical characteristics of the magnetic tunnel junction. The actual tuning frequencies can be simulated and experimentally determined.

Additionally, the pass bands of the comb filter of the invention can be tuned on the fly. That is, a magnetic field can be applied orthogonal (or in a different direction) to the direction of magnetization of the reference and sense layers. This applied field alters the pulse widths required to cause the magnetic tunnel junction to switch. Therefore, the frequencies of the pass-bands of the comb filter are altered. The effects of the magnetic fields applied in an orthogonal direction can be simulated and experimentally determined.

The pass band frequencies of the magnetic tunnel junction can be determined either experimentally, through simulation, or through a combination of both.

Figure 7:
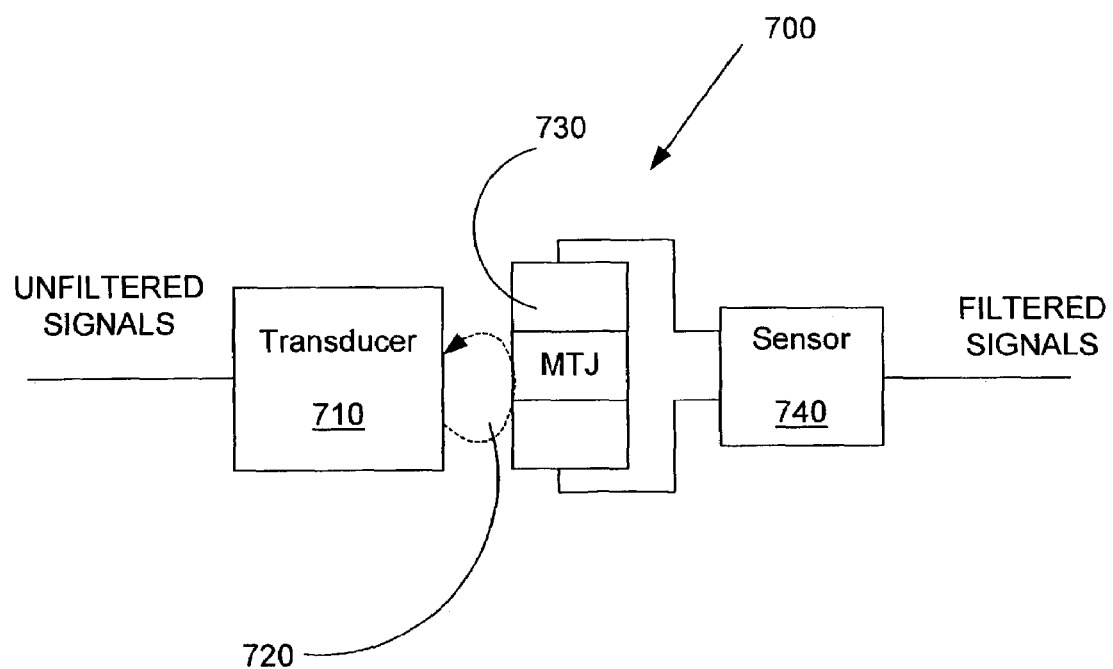
FIG. 7 shows a magnetic comb filter according to an embodiment of the invention.

FIG. 7 shows a magnetic comb filter 700 according to an embodiment of the invention. The magnetic comb filter 700 includes a magnetic transducer 710 for generating a magnetic field 720 in response to a plurality of information carrying signals. The magnetic comb filter 700 includes a magnetic tunnel junction 730. The magnetic tunnel junction 730 can be tuned to switch states in response to selected frequencies of the magnetic field 720. The magnetic comb filter 700 can further include a magnetic tunnel junction sensor 740 for sensing the states of the magnetic tunnel junction 730.

The magnetic transducer 710 must be responsive enough to generate magnetic field at the frequencies of the information carrying signals. The magnetic transducer can be implemented, for example, with an inductive coil that induces a magnetic field proportional to current conducted by the inductive coil.

The magnetic tunnel junction 730 is tuned to include frequency pass bands that align with the carrier frequencies of the information carrying signals.

The magnetic tunnel junction sensor 740 must be responsive enough to detect state changes of the magnetic tunnel junction 730 at the desired filter pass band frequencies.

Figure 8:
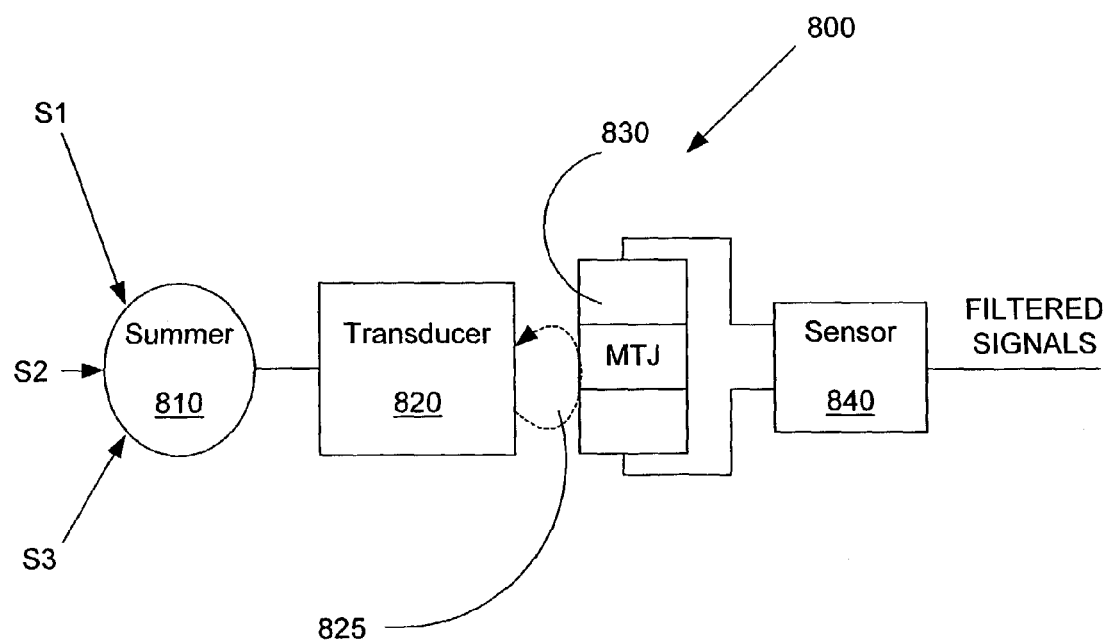
FIG. 8 shows a transmitter comb filter according to an embodiment of the invention.

FIG. 8 shows a transmitter comb filter 800 according to an embodiment of the invention. The transmitter comb filter 800 includes a summer 810 for summing a plurality of carrier signal sources S1, S2, S3 for generating a plurality of transmission signals. Each transmission signal has a unique carrier frequency, and includes transmission information. A magnetic transducer 820 generates a magnetic field 825 in response to the plurality of transmission signals. The transmitter comb filter 800 includes a magnetic tunnel junction 830. The magnetic tunnel junction 830 can be tuned to switch states in response to selected frequencies of the magnetic field 825. The transmitter comb filter 800 includes a magnetic tunnel junction sensor 840 for sensing the states of the magnetic tunnel junction 830.

Figure 9:
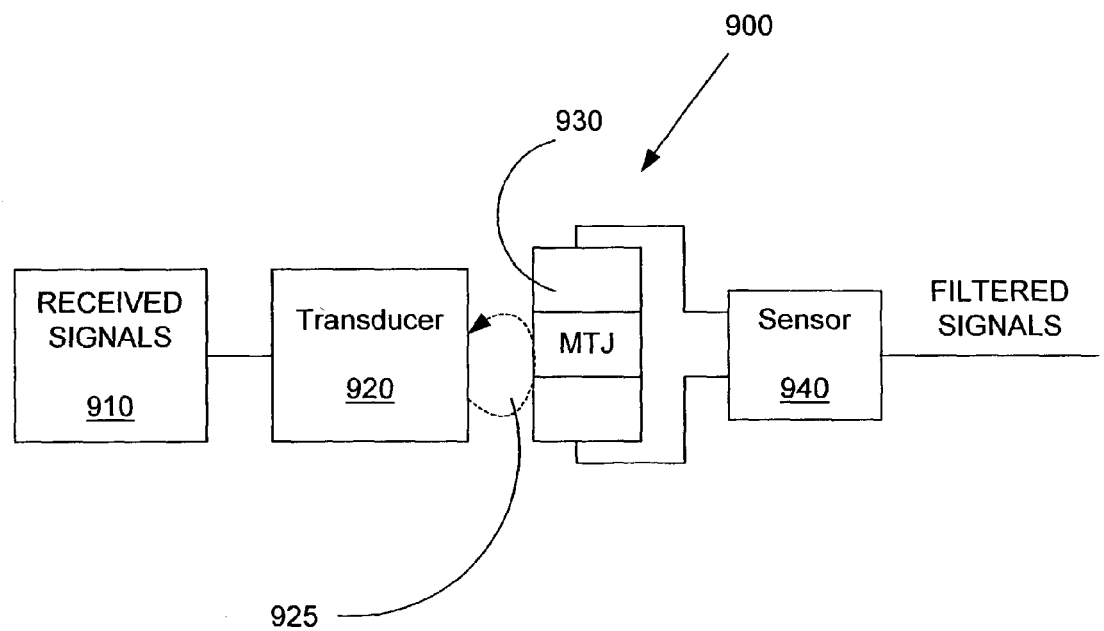
FIG. 9 shows a receiver comb filter according to an embodiment of the invention.

FIG. 9 shows a receiver comb filter 900 according to an embodiment of the invention. The receiver comb filter 900 includes receiver unit 910 for receiving a plurality of transmission signals. Each transmission signal includes a unique carrier frequency, and transmission information. The receiver unit can include an optical transducer that converts optical signals that have passed through an optical medium. The receiver comb filter 900 includes a magnetic transducer 920 for generating a magnetic field 925 in response to the plurality of transmission signals. The receiver comb filter 900 includes a magnetic tunnel junction 930. The magnetic tunnel junction 930 can be tuned to switch states in response to selected frequencies of the magnetic field 925. The receiver comb filter 800 includes a magnetic tunnel junction sensor 940 for sensing the states of the magnetic tunnel junction.

Figure 10:
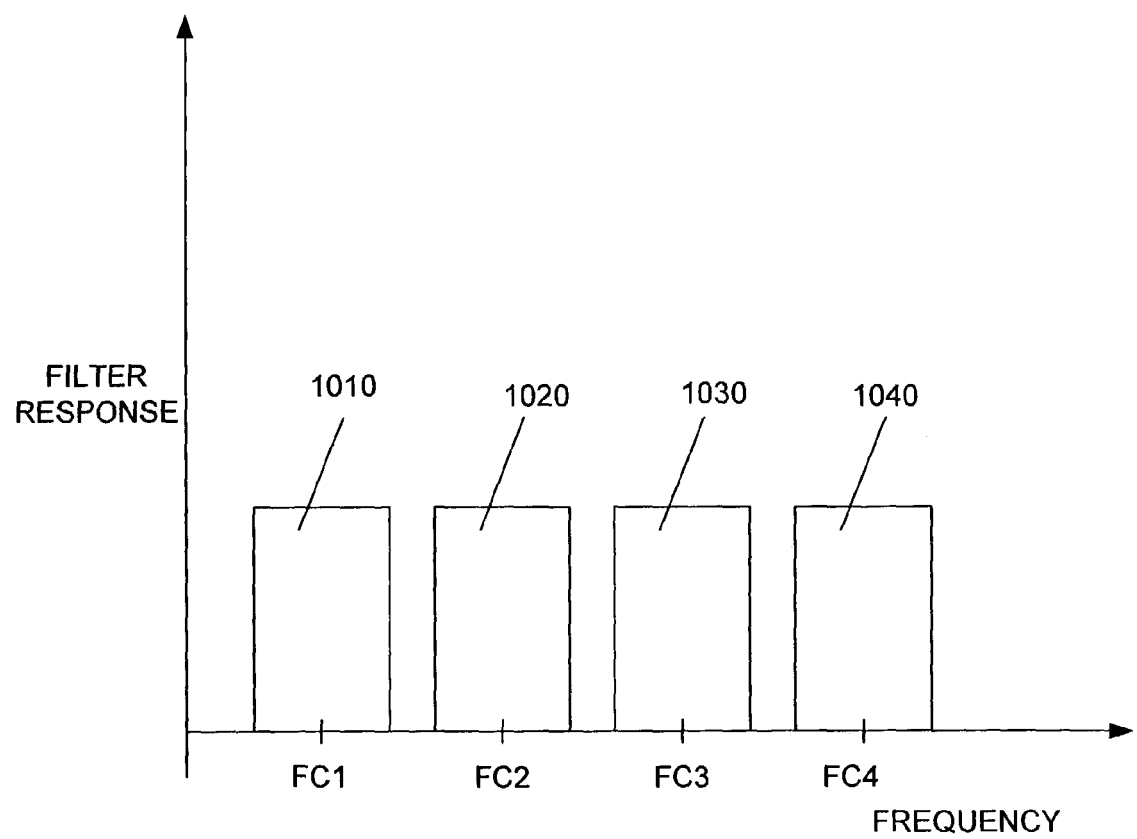
FIG. 10 shows a frequency response of a magnetic comb filter according to an embodiment of the invention.

FIG. 10 shows an ideal frequency response of a magnetic comb filter according to an embodiment of the invention. The frequency response allows particular frequency components to pass through the comb filter, while filtering or attenuating other frequency components. More precisely, the frequency response includes pass bands 1010, 1020, 1030, 1040. The invention provides selective filtering of electromagnetic signals. As previously described, the tuning of the pass bands of the filtering provided by the invention can be tuned. Additionally, the pass bands can be actively tuned in real-time by applying additional magnetic fields to the magnetic tunnel junctions of the invention. Generally, the additional magnetic fields are applied in an a direction that is orthogonal to the magnetic field generated by the applied signals to be filtered.

As previously described, the selective time/frequency switching characteristics of magnetic tunnel junctions can be experimentally or computationally determined. Therefore, the magnetic tunnel junctions can be tuned to selectively pass signals that include particular frequencies.

Many applications exist that can utilize the selective signal frequency pass bands of the invention. The descriptions provided here of signal transmitters and signal receivers that can utilize a frequency comb filter as provided by the invention are merely examples of useful applications of the invention. The invention can be utilized in many different applications where high frequency selective filtering is beneficial.

Figure 11:
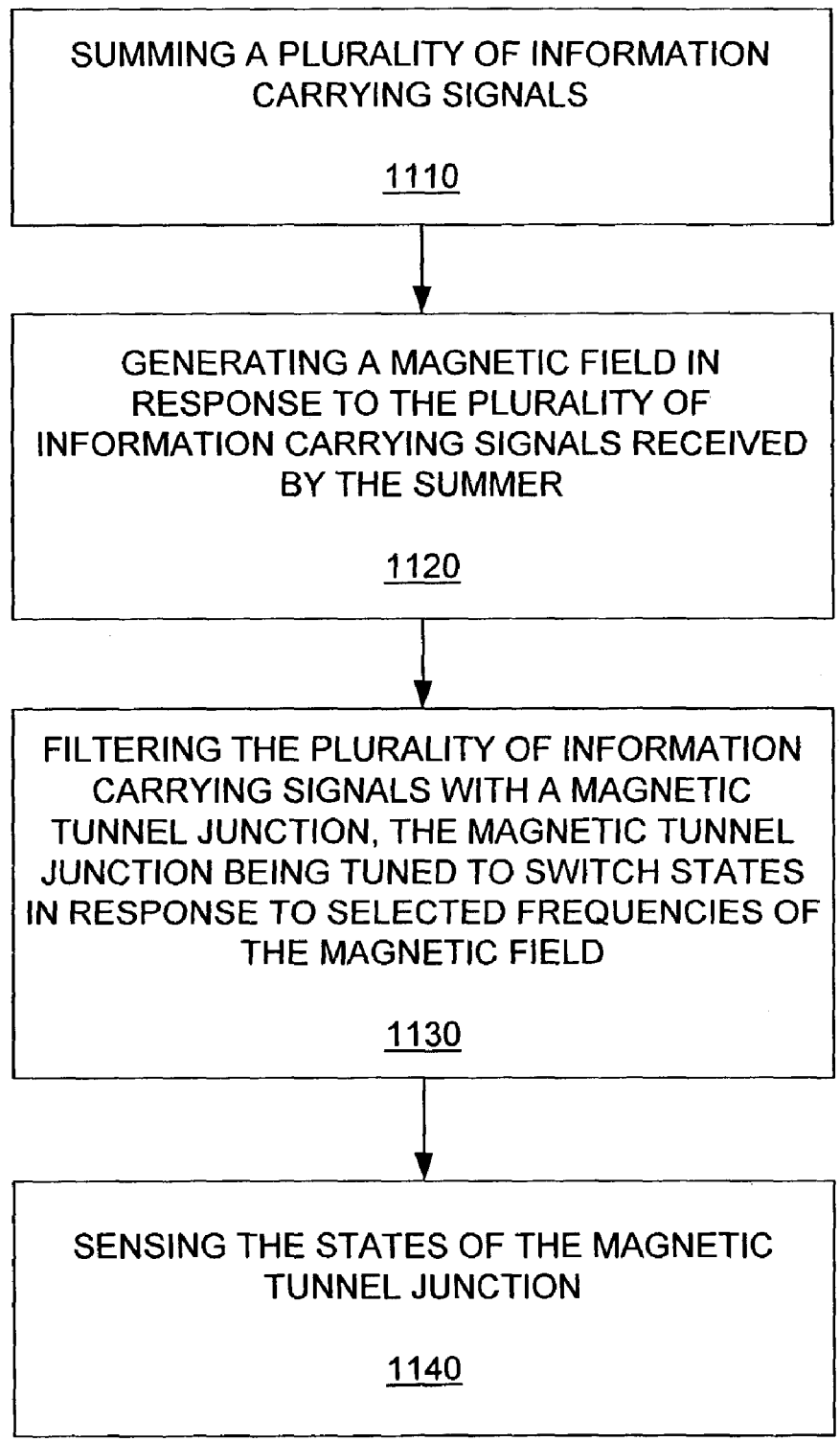
FIG. 11 is a flow chart that includes acts according to an embodiment of the invention.

FIG. 11 is a flow chart that includes acts according to an embodiment of the invention. The acts provide a method of filtering a plurality of separate frequency transmission signals.

A first act 1110 includes summing a plurality of information carrying signals.

A second act 1120 includes generating a magnetic field in response to the plurality of information carrying signals received by the summer.

A third act 1130 includes filtering the plurality of information carrying signals with a magnetic tunnel junction, the magnetic tunnel junction being tuned to switch states in response to selected frequencies of the magnetic field.

A fourth act 1140 includes sensing the states of the magnetic tunnel junction.

Although specific embodiments of the invention have been described and illustrated, the invention is not to be limited to the specific forms or arrangements of parts so described and illustrated. The invention is limited only by the appended claims.

What is claimed is:

1. A magnetic filter comprising:
   a magnetic transducer for generating a magnetic field in response to a plurality of information carrying signals;
   a magnetic tunnel junction, the magnetic tunnel junction being tuned to switch states in response to selected frequencies of the magnetic field; and
   a magnetic tunnel junction sensor for sensing the states of the magnetic tunnel junction.

2. The magnetic filter of claim 1, wherein the plurality of information signals are received by a multiple frequency signal summer which drives the magnetic transducer.

3. The magnetic filter of claim 1, wherein the plurality of information signals are received by a receiver unit that receives the plurality of information signals after the signals have passed through a transmission medium.

4. The magnetic filter of claim 1, wherein the tuning of the magnetic tunnel junction can be adjusted.

5. The magnetic filter of claim 4, wherein the tuning of the magnetic tunnel junction can be adjusted by proper selection of materials of the magnetic tunnel junction.

6. The magnetic filter of claim 4, wherein the tuning of the magnetic tunnel junction can be adjusted by proper selection of physical dimensions of the magnetic tunnel junction.

7. The magnetic filter of claim 4, wherein the tuning of the magnetic tunnel junction can be additionally adjusted by application of a different magnetic field bias to the magnetic tunnel junction.

8. The magnetic filter of claim 1, wherein the magnetic tunnel junction sensor is responsive enough to detect the states of the magnetic tunnel junction at the rates the magnetic tunnel junction changes states.

9. The magnetic filter of claim 1, wherein the magnetic transducer is responsive enough to generate the magnetic field at the frequencies the magnetic tunnel junction changes states.

10. The magnetic filter of claim 1, wherein the magnetic transducer comprises an inductive coil.

11. A transmitter comprising:
    a plurality of carrier signal sources for generating a plurality of transmission signals, each transmission signal including transmission information, each transmission signal having a unique carrier frequency;
    a magnetic transducer for generating a magnetic field in response to the plurality of transmission signals;
    a magnetic tunnel junction, the magnetic tunnel junction being tuned to switch states in response to selected frequencies of the magnetic field; and
    a magnetic tunnel junction sensor for sensing the states of the magnetic tunnel junction.

12. The transmitter of claim 11, wherein the tuning of the magnetic tunnel junction can be adjusted.

13. The transmitter of claim 12, wherein the tuning of the magnetic tunnel junction can be adjusted by proper selection of materials of the magnetic tunnel junction.

14. The transmitter of claim 12, wherein the tuning of the magnetic tunnel junction can be adjusted by proper selection of physical dimensions of the magnetic tunnel junction.

15. The transmitter of claim 12, wherein the tuning of the magnetic tunnel junction can be additionally adjusted by application of a different magnetic field bias to the magnetic tunnel junction.

16. A receiver comprising:
- means for receiving a plurality of transmission signals, each transmission signal including transmission information, each transmission signal having a unique carrier frequency;
- a magnetic transducer for generating a magnetic field in response to the plurality of transmission signals;
- a magnetic tunnel junction, the magnetic tunnel junction being tuned to switch states in response to selected frequencies of the magnetic field; and
- a magnetic tunnel junction sensor for sensing the states of the magnetic tunnel junction.

17. The receiver of claim 16, wherein the tuning of the magnetic tunnel junction can be adjusted.

18. The receiver of claim 17, wherein the tuning of the magnetic tunnel junction can be adjusted by proper selection of materials of the magnetic tunnel junction.

19. The receiver of claim 17, wherein the tuning of the magnetic tunnel junction can be adjusted by proper selection of physical dimensions of the magnetic tunnel junction.

20. The receiver of claim 17, wherein the tuning of the magnetic tunnel junction can be additionally adjusted by application of a different magnetic field bias to the magnetic tunnel junction.

21. A method of filtering a plurality of separate frequency transmission signals, the method comprising:
- summing a plurality of information carrying signals;
- generating a magnetic field in response to the plurality of information carrying signals received by the summer;
- filtering the plurality of information carrying signals with a magnetic tunnel junction, the magnetic tunnel junction being tuned to switch states in response to selected frequencies of the magnetic field; and
- sensing the states of the magnetic tunnel junction.

22. The method of filtering a plurality of separate frequency transmission signals of claim 21, wherein the tuning of the magnetic tunnel junction can be adjusted.

23. The method of filtering a plurality of separate frequency transmission signals of claim 22, further comprising the tuning of the magnetic tunnel junction by adjusting selection of materials of the magnetic tunnel junction.

24. The method of filtering a plurality of separate frequency transmission signals of claim 22, further comprising the tuning of the magnetic tunnel junction by adjusting selection of physical dimensions of the magnetic tunnel junction.

25. The method of filtering a plurality of separate frequency transmission signals of claim 22, further comprising tuning of the magnetic tunnel junction by application of a different magnetic field bias to the magnetic tunnel junction.

* * * * *